United States Patent
Kojima

(10) Patent No.: US 9,837,131 B2
(45) Date of Patent: Dec. 5, 2017

(54) SEMICONDUCTOR DEVICE AND OUTPUT CIRCUIT THEREOF

(71) Applicant: Winbond Electronics Corp., Taichung (TW)

(72) Inventor: Hidemitsu Kojima, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/431,778

(22) Filed: Feb. 14, 2017

(65) Prior Publication Data

US 2017/0278553 A1   Sep. 28, 2017

(30) Foreign Application Priority Data

Mar. 23, 2016  (JP) .................................. 2016-057792

(51) Int. Cl.
| | | |
|---|---|---|
| *G11C 7/10* | (2006.01) | |
| *G11C 7/12* | (2006.01) | |
| *G11C 7/22* | (2006.01) | |

(52) U.S. Cl.
CPC .............. *G11C 7/1057* (2013.01); *G11C 7/12* (2013.01); *G11C 7/22* (2013.01)

(58) Field of Classification Search
CPC ............ G11C 7/1057; G11C 7/12; G11C 7/22
USPC ..................................................... 365/189.05
See application file for complete search history.

(56) References Cited

U.S. PATENT DOCUMENTS

| | | | | | |
|---|---|---|---|---|---|
| 5,754,380 | A | * | 5/1998 | Ker | ...................... H01L 27/0251 257/E29.216 |
| 5,850,159 | A | * | 12/1998 | Chow | .............. H03K 19/00361 326/83 |
| 6,066,971 | A | * | 5/2000 | Pappert | ................... G05F 3/242 327/108 |
| 6,252,422 | B1 | * | 6/2001 | Patel | .................. H03K 19/0027 326/80 |

(Continued)

FOREIGN PATENT DOCUMENTS

| | | |
|---|---|---|
| JP | H01228318 | 9/1989 |
| JP | H06204756 | 7/1994 |

(Continued)

OTHER PUBLICATIONS

"Office Action of Taiwan Counterpart Application," dated Feb. 18, 2017, p. 1-p. 6.

(Continued)

*Primary Examiner* — Viet Q Nguyen
(74) *Attorney, Agent, or Firm* — JCIPRNET

(57) ABSTRACT

A semiconductor device and an output circuit thereof for accelerating rising of a pull-up transistor are provided. The output circuit of the invention includes an external terminal (130), an output buffer (110) and a pre-buffer circuit (120). The external terminal (130) can output output data to an external part. The output buffer (110) is connected to the external terminal (130) and includes a pull-up transistor (Qp1) of P type and a pull-down transistor (Qn1) of N type. The pre-buffer circuit (120) outputs a pull-up signal (PU) and a pull-down signal (PD) corresponding to the output data to the output buffer (110). The pre-buffer circuit (120) also includes a circuit (122). The circuit (122) negatively boosts the pull-up signal (PU) when the pull-up signal (PU) is changed from a high level into a low level.

14 Claims, 6 Drawing Sheets

(56) References Cited

U.S. PATENT DOCUMENTS

| | | | |
|---|---|---|---|
| 6,265,914 B1* | 7/2001 | Randhawa | H03K 19/00361 326/82 |
| 6,313,664 B1* | 11/2001 | Hall | H03K 17/167 326/26 |
| 6,559,690 B2* | 5/2003 | Waldrop | H03K 19/00315 327/108 |
| 6,571,376 B1* | 5/2003 | Levin | G06F 17/5036 326/87 |
| 7,317,333 B1* | 1/2008 | Zhou | H03K 19/0013 326/80 |
| 7,702,702 B2* | 4/2010 | Tanaka | G01R 19/2506 324/76.77 |
| 7,843,222 B1 | 11/2010 | Shiah et al. | |
| 7,893,720 B2* | 2/2011 | Yadav | H03K 19/018521 326/26 |
| 7,928,756 B1* | 4/2011 | Lu | H03K 19/0016 326/27 |
| 9,337,807 B2* | 5/2016 | Hollis | H03K 3/011 |
| 9,525,413 B2* | 12/2016 | Roberts | H03K 17/04123 |
| 9,621,035 B2* | 4/2017 | Nishimura | H02M 3/155 |
| 2002/0130690 A1* | 9/2002 | Waldrop | H03K 19/00315 327/108 |
| 2003/0141893 A1* | 7/2003 | Gonzalez | H03K 17/166 326/26 |
| 2006/0141894 A1* | 6/2006 | Hippke | B22F 7/006 445/26 |
| 2006/0220674 A1* | 10/2006 | Yeung | H03K 19/018528 326/29 |
| 2007/0047162 A1* | 3/2007 | Watanabe | H01L 27/0266 361/56 |
| 2008/0136443 A1* | 6/2008 | Wong | H03K 19/0005 326/30 |
| 2008/0303558 A1* | 12/2008 | Rho | H03K 19/00384 327/108 |
| 2013/0049817 A1* | 2/2013 | Di Vincenzo | H03K 19/018528 327/109 |
| 2016/0260455 A1* | 9/2016 | Dina | G11B 20/10222 |

FOREIGN PATENT DOCUMENTS

| | | |
|---|---|---|
| JP | H09237493 | 9/1997 |
| JP | 2003179480 | 6/2003 |
| JP | 2006279512 | 10/2006 |
| JP | 2012065235 | 3/2012 |
| JP | 2013090278 | 5/2013 |
| KR | 20030049451 | 6/2003 |
| WO | 2008014380 | 1/2008 |

OTHER PUBLICATIONS

"Office Action of Taiwan Counterpart Application," dated Jun. 5, 2017, p. 1-p. 8.

"Office Action of Japan Counterpart Application," with English translation thereof, dated May 16, 2017, p. 1-p. 6.

"Office Action of Korea Counterpart Application," dated Jul. 11, 2017, with English translation thereof, p. 1-p. 7.

* cited by examiner

SEMICONDUCTOR DEVICE AND OUTPUT CIRCUIT THEREOF

CROSS-REFERENCE TO RELATED APPLICATION

This application claims the priority benefit of Japan application serial no. 2016-057792, filed on Mar. 23, 2016. The entirety of the above-mentioned patent application is hereby incorporated by reference herein and made a part of this specification.

BACKGROUND OF THE INVENTION

1. Field of the Invention

The invention relates to an output circuit including a pull-up PMOS (P-channel Metal Oxide Semiconductor) transistor and a pull-down NMOS (N-channel Metal Oxide Semiconductor) transistor, and more particularly, to an output circuit of a semiconductor integrated circuit or a semiconductor storage device.

2. Description of Related Art

A CMOS (Complementary Metal-Oxide-Semiconductor) inverter or a push pull type output buffer is generally used in the output circuit of semiconductor devices, such as memory or logic IC (Integrated Circuit). Patent Document 1 discloses an output circuit which is constituted by transistors with a low breakdown voltage for constituting the CMOS inverter and capable of outputting a high voltage signal. Patent Document 2 discloses an output circuit for inhibiting switching noise.

PRIOR ART DOCUMENT

Patent Document

Patent Document 1: Japanese Patent Publication No. 2013-90278
Patent Document 2: Japanese Patent Publication No. 2012-65235

Problems to be Solved by the Invention

FIG. 1 shows a diagram of an example of a structure of an output circuit in conventional art. The output buffer includes: an output buffer 10, including a pull-up PMOS transistor Qp1 and a pull-down NMOS transistor Qn1; and a pre-buffer circuit 20, inputted with output data DATA and a read enable signal $\overline{RE}$, and outputting a pull-up signal PU and a pull-down signal PD to the transistor Qp1 and the transistor Qn1 of the output buffer 10. The output buffer 10 outputs the output data from an output node OUT to an input/output terminal 30 according to the pull-up signal PU and the pull-down signal PD.

FIG. 2 shows a timing chart of operations of the output circuit. Further, although illustration of the pull-down signal PD is omitted, such signal and the pull-up signal PU are co-phase. The pre-buffer circuit 20 generates the pull-up signal PU and the pull-down signal PD corresponding to the output data in response to a falling edge of the low active read enable signal $\overline{RE}$. For example, the read enable signal $\overline{RE}$ falls at a time t1. At the time, if the output data "0" is inputted, the pre-buffer circuit 20 will output the pull-up signal PU and the pull-down signal PD at an H level corresponding to the output data "0". In response to that, the pull-up transistor Qp1 is turned off, and the pull-down transistor Qn1 is turned on. At a time t2, the output data "0" is generated in the output node OUT. Further, if the read enable signal $\overline{RE}$ falls at a time t3 and the output data "1" is inputted at the time, the pre-buffer circuit 20 outputs the pull-up signal PU and the pull-down signal PD corresponding to the output data "1". In response to that, the pull-up transistor Qp1 is turned on, and the pull-down transistor Qn1 is turned off. At a time t4, the output data "1" is generated in the output node OUT.

In the semiconductor device, with miniaturization of transistor, a supply voltage for driving transistor also becomes low voltage. Therefore, a gate-source voltage Vgs of a transistor become smaller so a drain current Id also becomes smaller. For example, if a supply voltage VDD of the output buffer 10 becomes approximately 1.8 V, it is difficult to drive loadings connected to the input/output terminal 30 in high speed. As shown in FIG. 2, when the output data "0" is outputted, since the pull-down transistor Qn1 is turned on, an access time Ta started from the time t1 and ended at the time t2 is relatively shorter. However, when the output data "1" is outputted, since the pull-up transistor Qp1 is turned on, the following problems will arise: a rising of the pull-up transistor becomes slow so that an access time Tb started from the time t3 and ended at the time t4 becomes longer than what is necessary.

SUMMARY OF THE INVENTION

The invention aims to solve such conventional problem by providing an output circuit capable of accelerating the rising of the pull-up transistor compared to the conventional technology.

Technical Means for Solving the Problem

An output circuit of the invention includes: an external terminal; an output buffer, connected to the external terminal, and including a pull-up transistor of P type and a pull-down transistor of N type; and a pre-buffer circuit, inputted with output data, and supplying a pull-up signal and a pull-down signal corresponding to the output data to gates of the pull-up transistor and the pull-down transistor. The pre-buffer circuit includes a circuit for negatively boosting the pull-up signal to be negative when the pull-up signal is changed from a high (H) level into a low (L) level.

Preferably, the circuit for negatively boosting includes a first transistor of N type and a capacitor. The first transistor has one terminal connected to the pull-up signal and another terminal connected to the capacitor and applies a pulse to the capacitor when the first transistor is turned on. Preferably, the circuit for negatively boosting further includes a pulse generator for generating a one shot pulse of downward convex, and the negative one shot pulse is applied to the capacitor. Preferably, the circuit for negatively boosting further includes a delay circuit for delaying the one shot pulse and a second transistor connected between the another terminal of the first transistor and a reference potential, and the second transistor is turned off in a pulse width duration at the L level according to the one shot pulse before the delayed one shot pulse is applied to the capacitor. Preferably, the pull-up signal is boosted to be negative in a differential duration between a delay duration of the delay circuit and the pulse width duration at the L level of the one shot pulse. Preferably, the circuit for negatively boosting adjusts the delay duration and the pulse width duration at the L level to prevent a leakage current from generating in the first transistor along a PN direction. Preferably, the output circuit further includes an output control circuit for enabling or disabling the circuit for negatively boosting. Preferably, the output control circuit makes the pulse generator generate the one shot pulse when enabling the circuit for negatively boosting, and does not make the pulse generator generate the one shot pulse when disabling the circuit for negatively boosting. Preferably, the output control circuit further includes a third transistor. The third transistor is connected with the second transistor in parallel between the another terminal of the first transistor and the reference potential. The third transistor is turned off when enabling the circuit for negatively boosting. The third transistor is turned on when disabling the circuit for negatively boosting. Preferably, the output control circuit enables the circuit for negatively boosting when a voltage supplied to the output buffer is a first voltage, and disables the circuit for negatively boosting when the voltage is a second voltage greater than the first voltage.

A semiconductor device of the invention includes the output circuit with aforesaid structure. In the semiconductor device, the output control circuit has a storage component. The storage component stores setting information. The setting information is used for enabling or disabling the circuit for negatively boosting. Preferably, the storage component is a configuration register for storing the setting information provided from an external controller.

Effect of the Invention

According to the invention, with configuration of the circuit for negatively boosting the pull-up signal to be negative when the pull-up signal is changed from the H level into the L level, the gate-source voltage may become greater when the pull-up transistor is turned on. Therefore, the rising of the pull-up transistor may be accelerated accordingly. As a result, a time spent for outputting data at the H level by the output buffer may be shortened.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
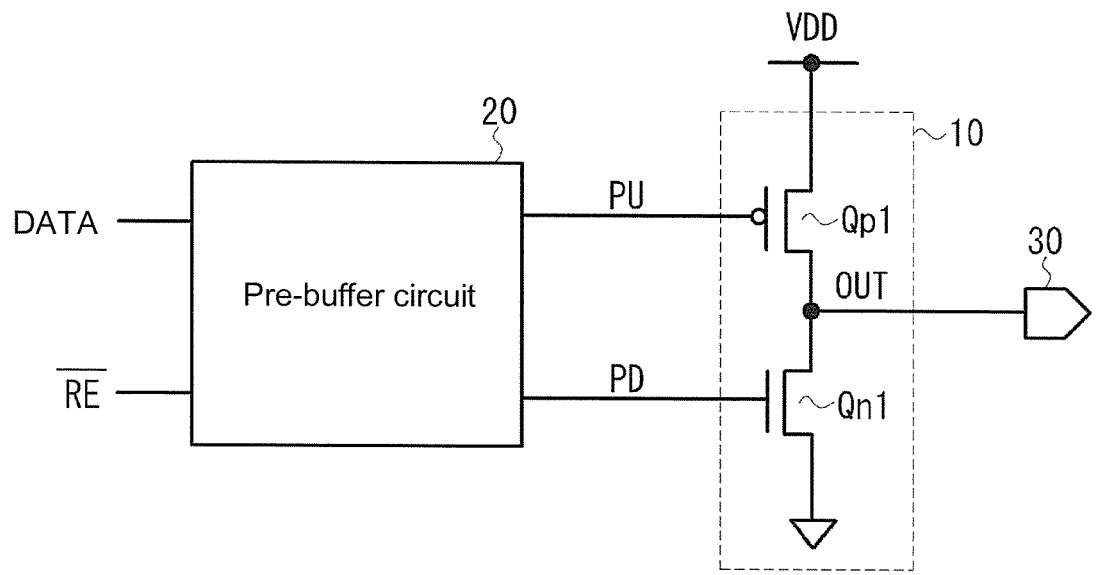
FIG. 1 is a diagram illustrating an example of an output circuit in conventional art.

Reference will now be made in detail to the present preferred embodiments of the invention, examples of which are illustrated in the accompanying drawings. Wherever possible, the same reference numbers are used in the drawings and the description to refer to the same or like parts.

An output circuit of the invention may be applied in a flash memory, a DRAM (Dynamic Random Access Memory), a SRAM (Static Random Access Memory), other memory devices or semiconductor devices such as a logic IC or a LSI (large scale integrated) circuit). In more preferred embodiments, the output circuit of the invention is applied to a semiconductor device driven by a low voltage (e.g., applied as an output circuit that can be driven by 1.8 V). In more preferred embodiments, the output circuit of the invention is at least connected to an external terminal for outputting output data to an external part. The external terminal may also be an external input/output terminal with functions for inputting input data.

Embodiments

Figure 3:
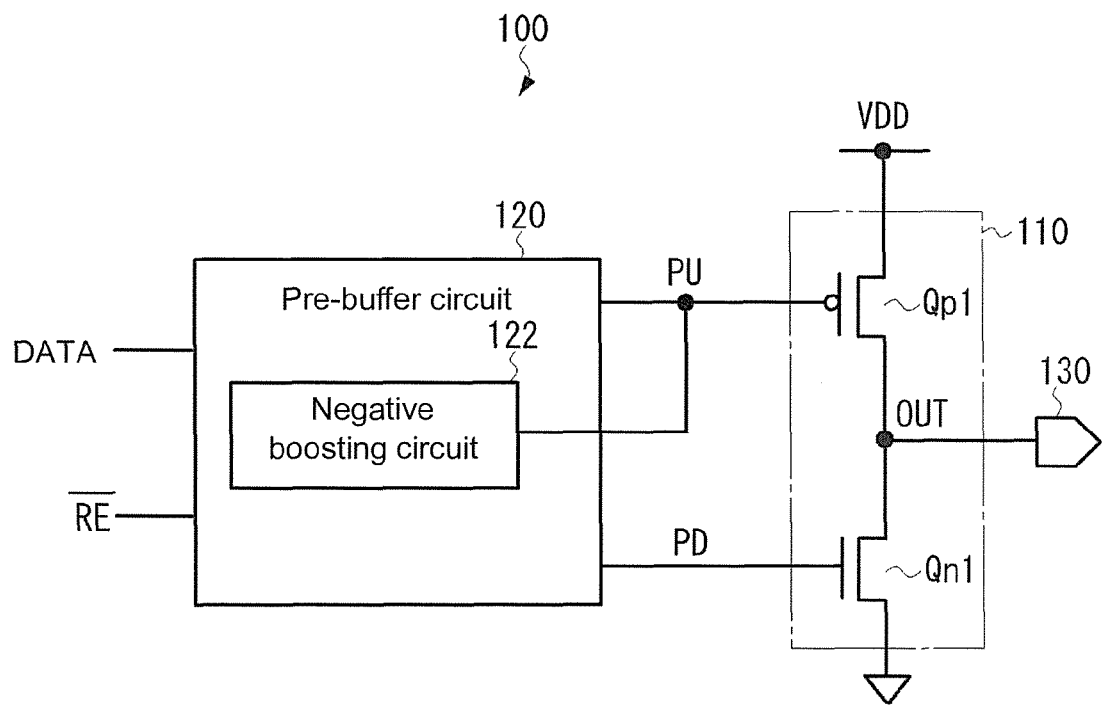
FIG. 3 is a diagram illustrating a structural example of an output circuit according to embodiments of the invention.

In the following, the embodiments of the invention are described with reference to accompanied drawings. FIG. 3 is a diagram illustrating a structural example of an output circuit according to embodiments of the invention. An output circuit 100 of the present embodiment includes: an output buffer 110 of CMOS structure, which includes a pull-up PMOS transistor Qp1 and a pull-down NMOS transistor Qn1, and outputs the output data from an output node OUT to an external terminal 130; and a pre-buffer circuit 120, which is connected to the output buffer 110.

The pre-buffer circuit 120 is inputted with output data DATA and a read enable signal $\overline{RE}$, generates a pull-up signal PU and a pull-down signal PD corresponding to the output data, supplies the generated pull-up signal PU to the pull-up transistor Qp1, and supplies the pull-down signal PD to the pull-down transistor Qn1. For example, the pre-buffer circuit 120 outputs the pull-up signal PU at an H level and the pull-down signal PD with the same phase when the output data "0" is inputted, and outputs the pull-up signal PU and the pull-down signal PD at a L level when the output data "1" is inputted.

For example, a source of the pull-up transistor Qp1 is connected to a supply voltage VDD of 1.8 V, a source of the pull-down transistor Qn1 is connected to GND, and drains of the two transistors are coupled to the output node OUT. When the pull-up signal PU at the H level and the pull-down signal PD at the H level are supplied, the transistor Qp1 is turned off, the transistor Qn1 is turned on, and the output data "0" is generated at the output node OUT. Further, when the pull-up signal PU at the L level and the pull-down signal PD at the L level are supplied, the transistor Qp1 is turned on, the transistor Qn1 is turned off, and the output data "1" is generated at the output node OUT.

The pre-buffer circuit 120 of the present embodiment includes a negative boosting circuit 122. The negative boosting circuit 122 boosts the pull-up signal PU to be a negative voltage when the pull-up signal PU is changed (falling) from the H level into the L level. In more preferred embodiments, the negative boosting circuit 122 negatively boosts the pull-up signal PU to be negative in a manner of synchronizing with a falling edge of the pull-up signal PU.

Figure 4:
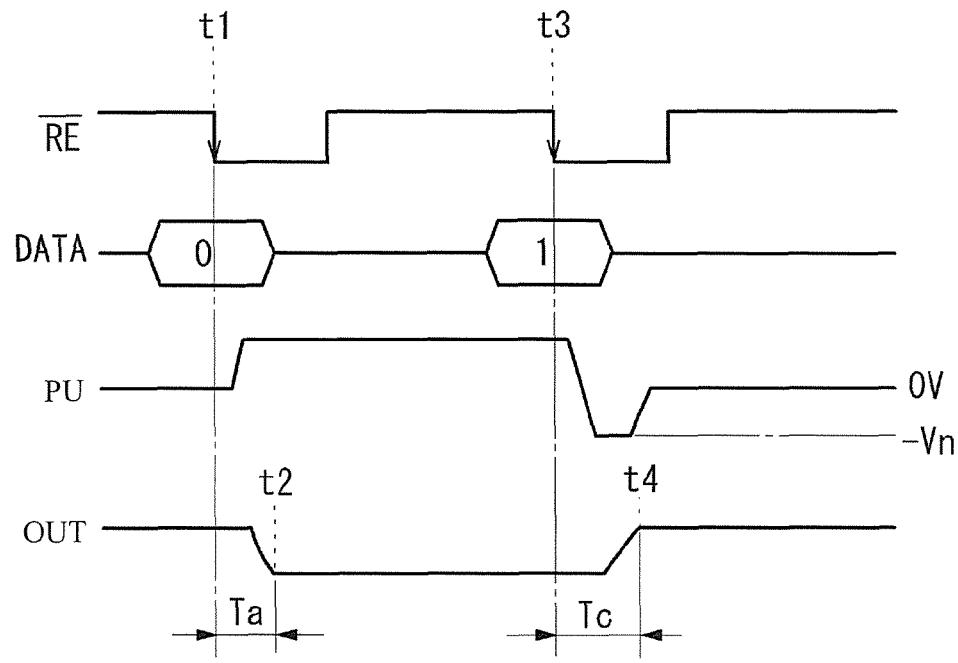
FIG. 4 is a diagram illustrating operation waveform is of the output circuit according to embodiments of the invention.

FIG. 4 shows a timing chart of the output circuit 100 according to the present embodiment. At a time t1, the read enable signal $\overline{RE}$ falls to the L level. At the time, if the output data "0" is inputted to the pre-buffer circuit 120, the pre-buffer circuit 120 generates the pull-up signal PU changed from the L level into the H level in correspondence to the output data "0" (the pull-down signal PD is also changed into the same) and outputs the same to the output buffer 110. In response to that, the transistor Qp1 is turned off and the transistor Qn1 is turned on. At a time t2, the output data "0" is outputted from the output node OUT. A duration Ta, started when the read enable signal $\overline{RE}$ is changed into the L level and ended when the output data "0" is outputted from the output node OUT, is started from the time t1 and ended at the time t2.

Figure 2:
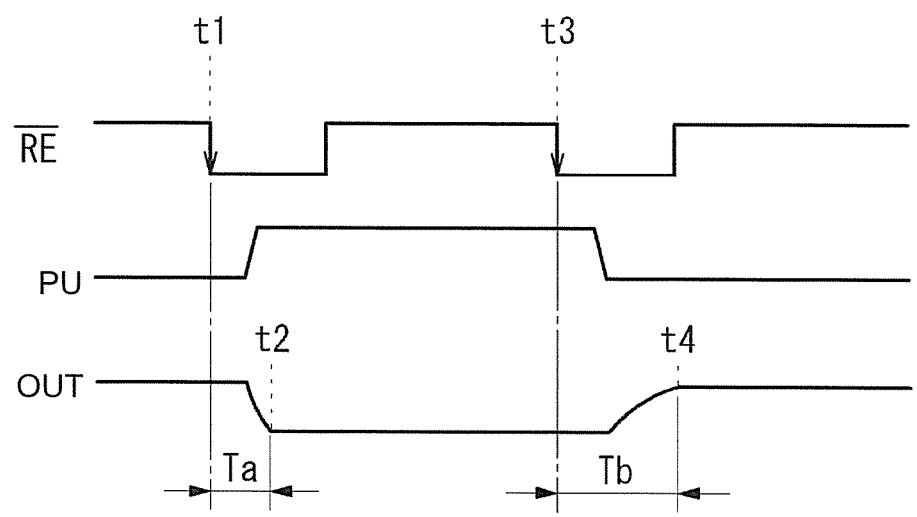
FIG. 2 is a diagram illustrating operation waveforms of the output circuit in conventional art.

On the other hand, the read enable signal $\overline{RE}$ falls to the L level at a time t3. At the time, if the output data "1" is inputted, the pre-buffer circuit 120 generates the pull-up signal PU changed from the H level into the L level in correspondence to the output data "1" (the pull-down signal PD is changed into the same) and outputs the same to the output buffer 110. In synchronization with falling of the pull-up signal PU, the negative boosting circuit 122 boosts the pull-up signal PU to a negative potential Vn in a fixed duration. The transistor Qp1 is turned on by the pull-up signal PU. However, since the pull-up signal PU is boosted to the negative potential Vn, the gate-source voltage Vgs of the transistor Qp1 becomes |Vn|+VDD. The voltage Vgs is greater than before it is negatively boosted to be negative (i.e., when the gate-source voltage Vgs is VDD). As a result, the transistor Qp1 is strongly turned on, the drain current Id becomes greater, a loading capacitance connected to the external terminal 130 receives a rapid charge, and a potential of the output node OUT is rapidly boosted to the VDD voltage. As such, a duration Tc started when the read enable signal $\overline{RE}$ is changed into the L level and ended when the output data "1" is outputted (started from a time t3 and ended at a time t4) may become shorter than a duration Tb in conventional art (referring to FIG. 2).

Figure 5:
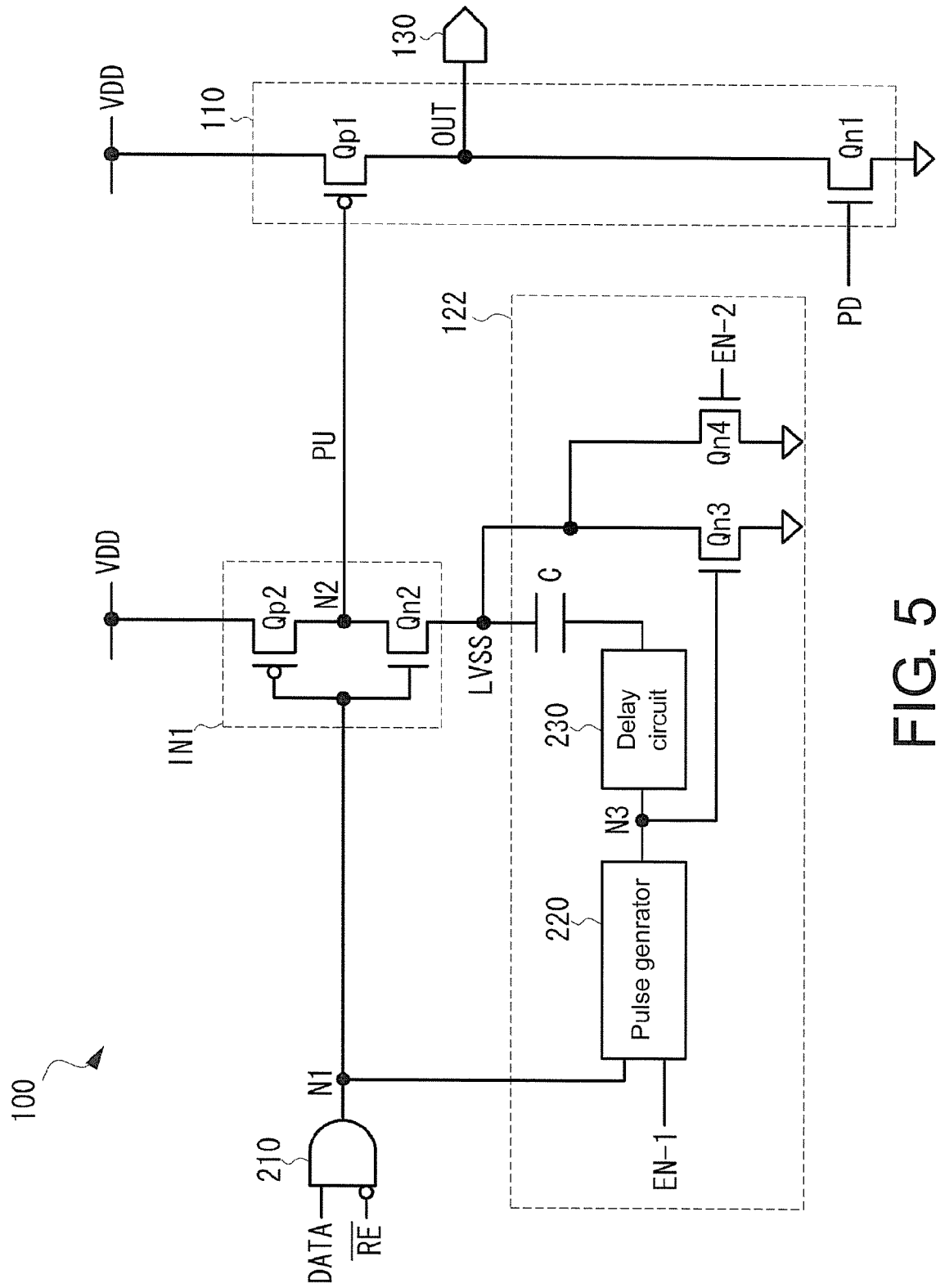
FIG. 5 is a specific circuit diagram illustrating the output circuit according to embodiments of the invention.

Next, FIG. 5 shows a preferred circuit example of the output circuit 100 according to the present embodiment. The pre-buffer circuit 120 includes an AND gate 210 and an inverter IN1. The output data DATA and the read enable signal $\overline{RE}$ are inputted to the AND gate 210. When the read enable signal $\overline{RE}$ is at the L level, data corresponding to the DATA is generated at a node N1. The inverter IN1 includes a PMOS transistor Qp2 and an NMOS transistor Qn2, and the inverter IN1 generates data inverted to that of the node N1 at a node N2. A voltage generated at the node N2 serves as the pull-up signal PU to be supplied to a gate of the pull-up transistor Qp1 of the output buffer 110. In addition, although it is not illustrated herein, the pull-down signal PD and the pull-up signal PU are co-phase, and the signal PD is supplied to a gate of the pull-down transistor Qn1. The supply voltage VDD of the inverter IN1 and the output buffer 110 is, for example, 1.8 V.

The negative boosting circuit 122 is constituted by including a pulse generator 220, a delay circuit 230, a capacitor C, NMOS transistors Qn3 and Qn4. The pulse generator 220 inputs the a voltage generated at the node N1 and an enable signal EN-1. When the enable signal EN-1 is enabled, a rising edge of the node N1 is detected, and a one shot pulse signal of downward convex is outputted to a node N3. On the other hand, when the enable signal EN-1 is disabled, a pulse generating function of the pulse generator 220 is disabled so the node N3 stays at the H level regardless of what state the node N1 is in. The one shot pulse of downward convex is a pulse signal changed from the H level into the L level, maintained in a pulse width duration at the L level, and then changed from the L level into the H level.

The delay circuit 230 is connected in series with the output node N3 of the pulse generator 220 so as delay the one shot pulse generated by the pulse generator 220 for a fixed period of time. Elements for constituting the delay circuit 230 are not particularly limited, and may be constituted by using inverters, for example. The capacitor C is connected between the delay circuit 230 and a node LVSS. The node LVSS is connected to a source of the NMOS transistor Qn2 of the inverter IN1. Further, the two NMOS transistors Qn3 and Qn4 connected in parallel are connected to the node LVSS. A gate of the transistor Qn3 is connected to the output node N3 of the pulse generator 220, and a gate of the transistor Qn4 is connected to an enable signal EN-2.

The enable signals EN-1 and EN-2 are signals for selectively driving the negative boosting circuit 122. When it is not desired to make the negative boosting circuit 122 operative, the pulse generator 220 may be disabled by the enable signal EN-1 and setting the enable signal EN-2 to the H level. As such, the transistor Qn4 is turned on to fix the node LVSS at the GND potential.

Figure 6:
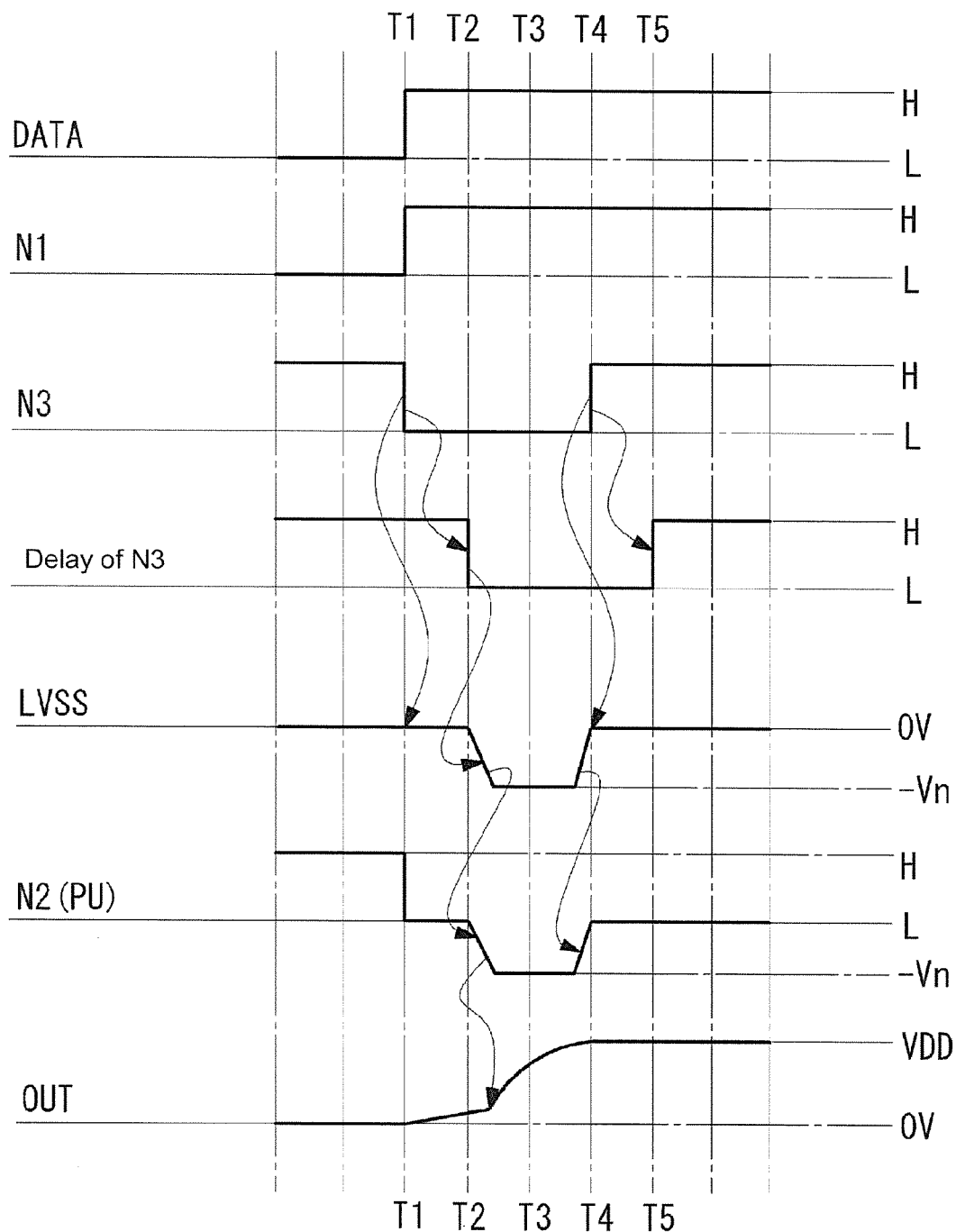
FIG. 6 is a diagram illustrating operation waveforms of the output circuit shown in FIG. 5.

Next, FIG. 6 shows a timing chart of the output circuit 100. Here, the timing chart for enabling the enable signals EN-1 and EN-2 in order to set the negative boosting circuit 122 to an operative state is illustrated. At a time T1, if the DATA at the H level is inputted to the pre-buffer circuit 120, the node N1 becomes the H level and the node N2 is changed into the L level at roughly the same time. The pulse generator 220 generates the one shot pulse to the node N3 in a duration started the time T1 and ended at a time T4 in response to a rising edge of the node N1. With generation of the one shot pulse, the transistor Qn3 connected to the node N3 is turned off in the pulse width duration at the L level (a duration started from the time T1 and ended at the time T4). Further, the transistor Qn4 is turned off according to the enable signal EN-2. Therefore, while the transistor Qn3 is turned off, the node LVSS is separated from GND to be a floating state.

The one shot pulse delayed by the delay circuit 230 is applied to the capacitor C at a time T2. One of electrodes of the capacitor C is connected to the node LVSS in the floating sate. Therefore, if the one shot pulse changed from the H level into the L level is applied to another one of the electrodes of the capacitor C, the node LVSS is negatively boosted to be negative in response to that. The transistor Qn2 is turned on according to the H level of the node N1 and boosted to the negative voltage by the node LVSS, such that a source is pulled to be negative and a voltage of the node N2 is negatively boosted to be negative. That is, the voltage is for negatively boosting the pull-up signal PU to be negative. As a result, the gate-source voltage of the pull-up transistor Qp1 is greater than VDD by the negative voltage, a large drain current flows, and the potential of the output node OUT is rapidly boosted to VDD.

At the time T4, if the one shot pulse is changed from the L level into the H level, the transistor Qn3 is turned on, the node LVSS becomes the GND potential, and the pull-up signal PU also becomes the GND potential. Meanwhile, the output node OUT is already charged to the VDD potential. At a time T5, the delayed pulse is changed from the L level into the H level, and such pulse is applied to the capacitor C. However, since the node LVSS is connected to GND, the potential of the node LVSS is rarely changed.

A duration between the time T1 and the time T2 is a duration in which the one shot pulse is delayed. By shortening a delay time, the pull-up signal PU may be negatively boosted to be negative instantly at a time point when the pull-up signal PU falls. Further, the duration between the time T1 and the time T4 is the pulse width duration at the L level of the one shot pulse. In a differential duration (the time T2 to the time T4) between the pulse width duration and a delay duration, the pull-up signal PU is negatively boosted to be negative. Therefore, the output OUT may be boosted to VDD by optimizing the pulse width duration at the L level and the delay duration. On the other hand, it is more preferred that, when the source of the transistor Qn2 is negatively boosted to be negative, the pulse width duration and the delay duration and/or a size of the capacitor C are adjusted so the negatively boosted voltage will not exceed a threshold of a PN junction. The transistor Qn2 is formed in a P type silicon substrate or a P-well, and a P-type region is connected to GND. When an N type source is boosted to be the negative voltage, if the negative voltage exceeds the threshold of the PN junction, a leakage current will flow along a PN direction, resulting a possible latch up to be generated by the inverter IN1. Therefore, it is more preferred to prevent such leakage current.

Figure 7:
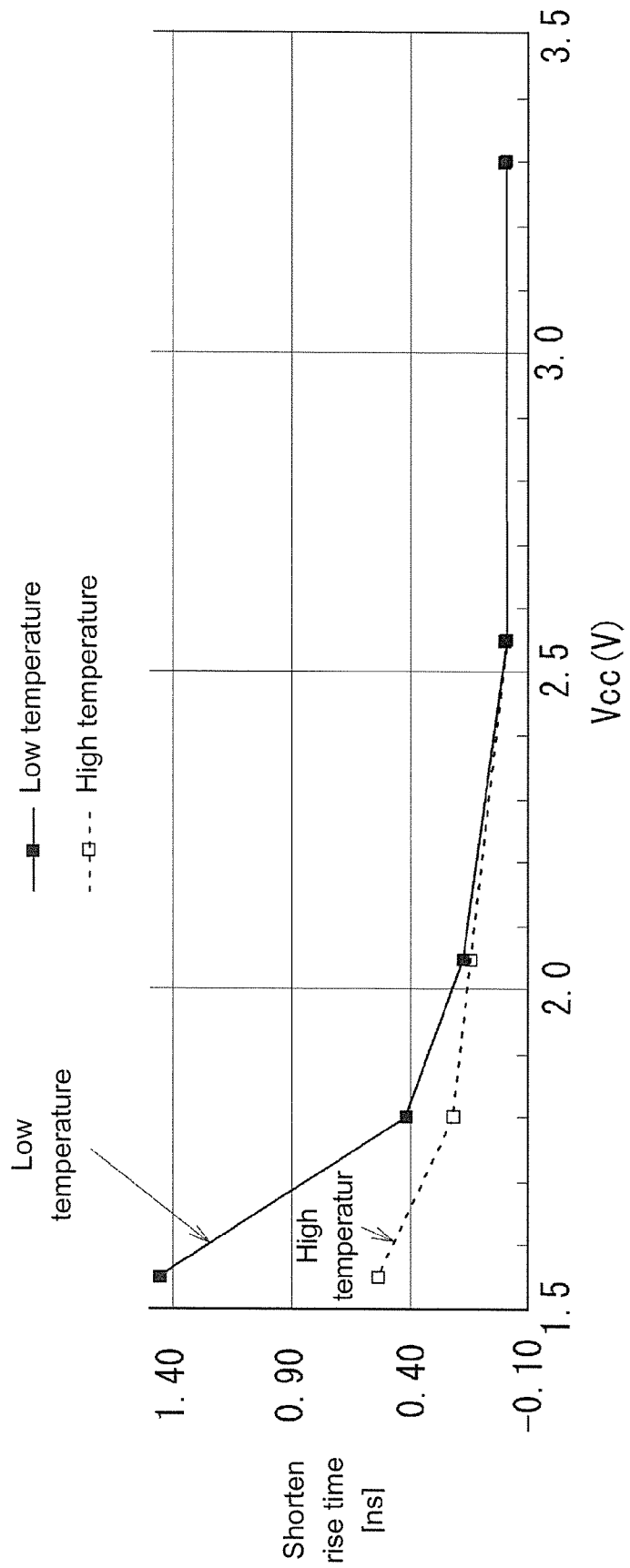
FIG. 7 is a diagram illustrating effects provided according to embodiments of the invention.

FIG. 7 is a graph showing effects when a simulation is performed on the output circuit shown in FIG. 5. The graph shows a rise time of the PMOS pull-up transistor operated under different operating temperatures and different supply voltages.

Referring to FIG. 7, when a supply voltage Vcc is approximately 3 V, a difference between the supply voltage Vcc and threshold of the transistor is relatively greater, and thus a relatively greater drain current will flow. Therefore, it shows no improvement on the rise time of the PMOS transistor even if the pull-up signal is negatively boosted to be negative. However, if the supply voltage Vcc is less than 2.0 V, an effect of improvement on the rise time may be shown as compared to the condition before negatively boosting. Further, the effect is more outstanding in a low temperature operation than in a high temperature operation. This is because the threshold will increase and the difference between the threshold and the supply voltage will become smaller if the operating temperature is low.

Figure 8:
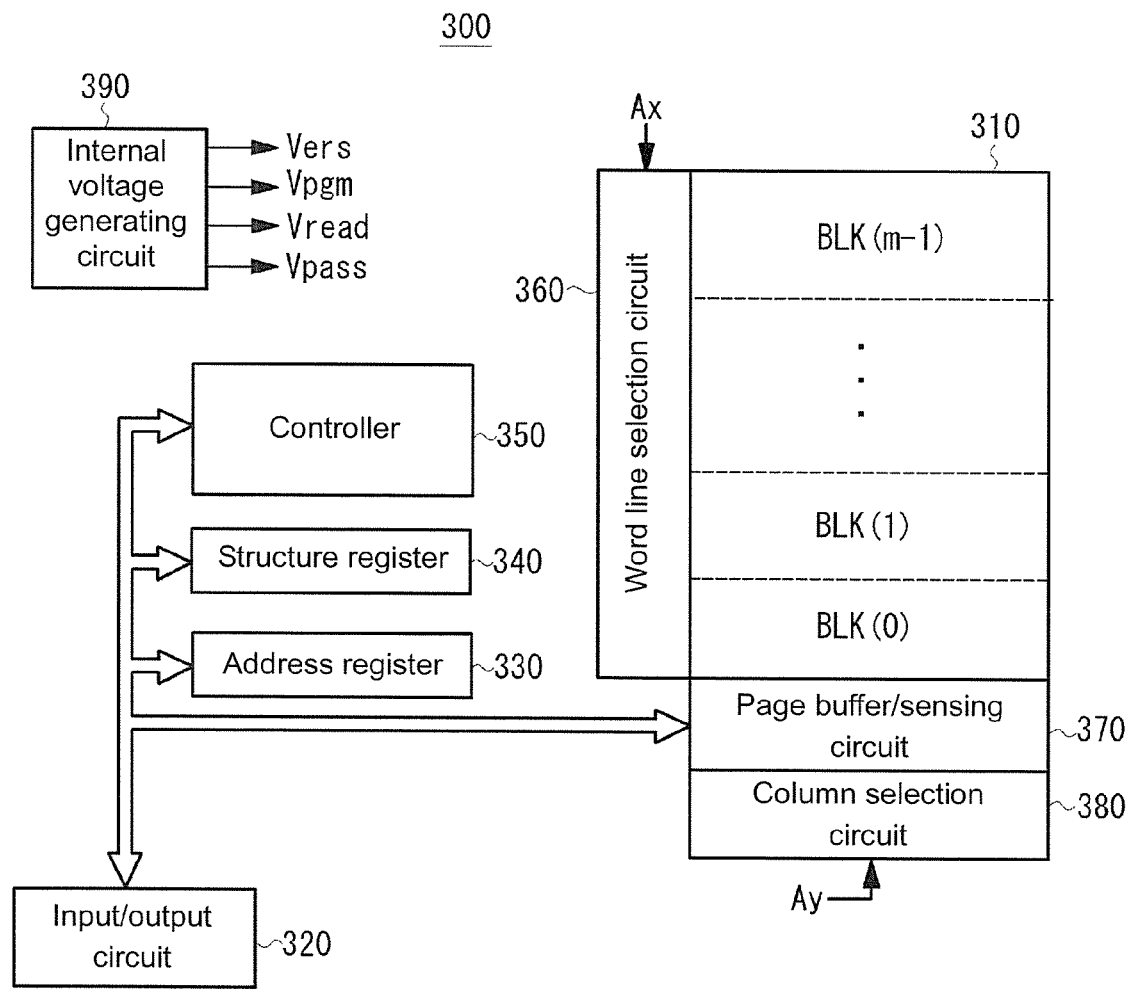
FIG. 8 is a diagram illustrating a structure of a flash memory according to the second embodiment of the invention.

Next, a second embodiment of the invention is described below. The second embodiment relates to a flash memory having the output circuit constituted according to the first embodiment. FIG. 8 is a diagram illustrating a typical structure of the flash memory. A flash memory 300 includes: a memory array 310, in which a plurality of memory cells in form of NAND strings are arranged in matrix; an input/output circuit 320, connected to an external input/output terminal I/O, and inputting/outputting data; an address register 330, receiving address data from the input/output circuit 320; a configuration (structure) register 340, receiving configuration data from the input/output circuit 320; a controller 350, receiving command from the input/output circuit 320 or a control signal from the external part in order to control each part; a word line selection circuit 360, receiving row address information Ax from the address register 330, decoding the row address information Ax, and performing a block selection and a word line selection based on a decoding result thereof; a page buffer/sensing circuit 370, holding data read from a page selected by the word line selection circuit 360, or holding data to be written to the selected page; a column selection circuit 380, receiving column address information Ay from the address register 330, decoding the column address information Ay, and selecting data in the page buffer/sensing circuit 370 based on a decoding result thereof; and an internal voltage generating circuit 390, generating various voltages (a write voltage Vpgm, a pass voltage Vpass, a read pass voltage Vread, an erase voltage Vers, etc.) required for reading, programming and erasing data.

The output circuit 100 of the first embodiment is applied as the input/output circuit 320 of the flash memory 300. That is to say, in a read operation, the output circuit 100 outputs data read from the memory array 310.

The configuration register 340 may be accessed by an external controller. The external controller sets information regarding whether to make the negative boosting circuit of the input/output circuit 320 operative for the configuration register 340. For example, in the case where the configuration register 340 is set with flag information for making the negative boosting circuit operative, when read data "1" is outputted, the controller 350 makes the pulse generator 220 generate the one shot pulse by the enable signal EN-1 shown in FIG. 5 based on the set flag information. And, the enable signal EN-2 is driven to the L level, so as to ensure that the transistor Qn4 is turned off. On the other hand, in the case where the flag information for making the negative boosting circuit inoperative is set, the controller 350 disables the pulse generator by the enable signal EN-1 based on the flag information. And, the enable signal EN-2 is driven to the H level, so as to ensure that the transistor Qn4 is turned on.

In the flash memory 300, the option of whether to make the negative boosting circuit operative may be active when there are strict requirements on an access time for the read data, for example. At the time, by activating the negative boosting circuit, a time required for reading of the output data "1" may be shortened. Further, the internal voltage generating circuit 390 can, for example, selectively generate supply voltages of 3.3 V or 1.8 V so the input/output circuit 320 may be active when being operative by any of the supply voltages or 3.3 V or 1.8 V. The negative boosting circuit may be made operative if the input/output circuit 320 is operative by the supply voltage of 1.8 V, whereas negative boosting circuit may be made disabled if the input/output circuit 320 is operative by the supply voltage of 3.3 V. By doing so, even if the flash memory is operated in a power-saving mode driven by the low voltage (1.8 V, etc.), the read time of the output data "1" may be prevented from delaying.

Further, in other preferred embodiments, in addition to the configuration register 340, the setting of whether to make the negative boosting circuit operative may also be performed by, for example, setting the flag information in a fuse ROM (Read Only Memory) and so on, such that an operative state of flash memory may be fixedly set as a factory setting.

In the foregoing embodiments, illustration of the pre-buffer circuit 120 including the negative boosting circuit 122 is merely an example, and the invention is not limited thereto. For example, the negative boosting circuit 122 may also be an independent structure separated from the pre-boosted circuit 120. Moreover, in the foregoing embodiments, although the elements for delaying the one shot pulse of downward convex adopted use of the inverter, other elements may also be used for delaying. Further, the supply voltage VDD of the pre-buffer circuit 120 and the supply voltage VDD of the output buffer 110 may be identical or different. Further, the pre-buffer circuit 120 is also capable of generating a pull-up control signal and a pull-down control signal each having a logic level identical to a logic level of the data being inputted or a logic level in inverted phase of the logic level of the data being inputted.

Further, in the foregoing embodiments, the circumstances where the supply voltages of the output buffer being 1.8 V or 3.3 V are shown. However, those voltages are merely an example, and the invention is not limited by these voltages.

Further, in the foregoing embodiments, it is illustrated that the output circuit is provided for the NAND flash memory. Nonetheless, the output circuit of the invention may also be applied in other memory devices or logic devices. Further, in the present embodiment, although it is illustrated that the output node OUT is connected to the external input/output terminal, the output node may also be connected to the external output terminal.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. An output circuit of semiconductor device, comprising:
    an external terminal;
    an output buffer, connected to the external terminal, and comprising a pull-up transistor of P type and a pull-down transistor of N type; and
    a pre-buffer circuit, inputted with output data, and supplying a pull-up signal and a pull-down signal corresponding to the output data to gates of the pull-up transistor and the pull-down transistor,
    the pre-buffer circuit comprising a circuit for negatively boosting the pull-up signal to be negative when the pull-up signal is changed from a high level into a low level, wherein
    the circuit for negatively boosting comprises a first transistor of N type and a capacitor, the first transistor having one terminal connected to the pull-up signal and another terminal connected to the capacitor and applying a pulse to the capacitor when the first transistor is turned on.

2. The output circuit of semiconductor device according to claim 1, wherein
    the circuit for negatively boosting further comprises a pulse generator for generating a one shot pulse of downward convex, the negative one shot pulse being applied to the capacitor.

3. The output circuit of semiconductor device according to claim 2, wherein
    the circuit for negatively boosting further comprises a delay circuit for delaying the one shot pulse and a second transistor connected between the another terminal of the first transistor and a reference potential, and
    the second transistor is turned off in a pulse width duration at the low level according to the one shot pulse before the delayed one shot pulse is applied to the capacitor.

4. The output circuit of semiconductor device according to claim 3, wherein
    the pull-up signal is boosted to be negative in a differential duration between a delay duration of the delay circuit and the pulse width duration at the low level of the one shot pulse.

5. The output circuit of semiconductor device according to claim 4, wherein
    the circuit for negatively boosting adjusts the delay duration and the pulse width duration at the low level to prevent a leakage current from generating in the first transistor along a PN direction.

6. The output circuit of semiconductor device according to claim 3, wherein
    the output circuit further comprises: an output control circuit for enabling or disabling the circuit for negatively boosting.

7. The output circuit of semiconductor device according to claim 6, wherein
    the output control circuit makes the pulse generator generate the one shot pulse when enabling the circuit for negatively boosting, and does not make the pulse generator generate the one shot pulse when disabling the circuit for negatively boosting.

8. The output circuit of semiconductor device according to claim 6, wherein
    the output control circuit further comprises a third transistor, the third transistor being connected with the second transistor in parallel between the another terminal of the first transistor and the reference potential, wherein the third transistor is turned off when enabling the circuit for negatively boosting, and the third transistor is turned on when disabling the circuit for negatively boosting.

9. The output circuit of semiconductor device according to claim 6, wherein
    the output control circuit enables the circuit for negatively boosting when a voltage supplied to the output buffer is a first voltage, and disables the circuit for negatively boosting when the voltage is a second voltage greater than the first voltage.

10. A semiconductor device, comprising the output circuit in claim 6,
    the output control circuit having a storage component, the storage component storing setting information, the setting information being used for enabling or disabling the circuit for negatively boosting.

11. The semiconductor device according to claim 10, wherein
    the storage component is a configuration register for storing the setting information provided from an external controller.

12. An output circuit of semiconductor device, comprising:
    an external terminal;
    an output buffer, connected to the external terminal, and comprising a pull-up transistor of P type and a pull-down transistor of N type;
    a pre-buffer circuit, inputted with output data, and supplying a pull-up signal and a pull-down signal corresponding to the output data to gates of the pull-up transistor and the pull-down transistor, the pre-buffer circuit comprising a circuit for negatively boosting the pull-up signal to be negative when the pull-up signal is changed from a high level into a low level; and
    an output control circuit for enabling or disabling the circuit for negatively boosting,
    wherein the circuit for negatively boosting comprises a first transistor of N type and a capacitor, the first transistor having one terminal connected to the pull-up signal and another terminal connected to the capacitor and applying a pulse to the capacitor when the first transistor is turned on.

13. The output circuit of semiconductor device according to claim 12, wherein
    the circuit for negatively boosting further comprises a pulse generator for generating a one shot pulse of downward convex, the negative one shot pulse being applied to the capacitor,
    the output control circuit makes the pulse generator generate the one shot pulse when enabling the circuit for negatively boosting, and does not make the pulse generator generate the one shot pulse when disabling the circuit for negatively boosting.

14. The output circuit of semiconductor device according to claim 12, wherein
- the circuit for negatively boosting further comprises a pulse generator for generating a one shot pulse of downward convex, the negative one shot pulse being applied to the capacitor,
- the circuit for negatively boosting further comprises a delay circuit for delaying the one shot pulse and a second transistor connected between the another terminal of the first transistor and a reference potential, and
- the second transistor is turned off in a pulse width duration at the low level according to the one shot pulse before the delayed one shot pulse is applied to the capacitor,
- the output control circuit further comprises a third transistor, the third transistor being connected with the second transistor in parallel between the another terminal of the first transistor and the reference potential, wherein the third transistor is turned off when enabling the circuit for negatively boosting, and the third transistor is turned on when disabling the circuit for negatively boosting.

\* \* \* \* \*